US012159665B2

(12) United States Patent
Cui et al.

(10) Patent No.: US 12,159,665 B2
(45) Date of Patent: *Dec. 3, 2024

(54) METHOD OF PROGRAMMING MEMORY DEVICE AND RELATED MEMORY DEVICE

(71) Applicant: YANGTZE MEMORY TECHNOLOGIES CO., LTD., Wuhan (CN)

(72) Inventors: Ying Cui, Wuhan (CN); Jianquan Jia, Wuhan (CN); Kaikai You, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/204,266

(22) Filed: May 31, 2023

(65) Prior Publication Data

US 2023/0307040 A1    Sep. 28, 2023

Related U.S. Application Data

(63) Continuation of application No. 17/241,010, filed on Apr. 26, 2021, now Pat. No. 11,705,190, which is a (Continued)

(51) Int. Cl.
  *G11C 11/56*   (2006.01)
  *G11C 16/04*   (2006.01)
  (Continued)

(52) U.S. Cl.
  CPC ...... *G11C 11/5628* (2013.01); *G11C 16/0483* (2013.01); *G11C 16/24* (2013.01); *H10B 41/27* (2023.02)

(58) Field of Classification Search
  CPC . G11C 11/5628; G11C 16/24; G11C 16/0483; H01L 27/11556
  See application file for complete search history.

(56) References Cited

U.S. PATENT DOCUMENTS 8,064,252 B2    11/2011   Yip
8,634,251 B2    1/2014    Chung
(Continued)

FOREIGN PATENT DOCUMENTS

CN        101681295 A        3/2010
CN        102376357 A        3/2012
(Continued)

*Primary Examiner* — Khamdan N. Alrobaie
(74) *Attorney, Agent, or Firm* — BAYES PLLC

(57) ABSTRACT

A memory device includes memory cells in rows, word lines respectively coupled to the rows, and a control circuitry coupled to the memory cells via the word lines. The control circuitry is configured to apply a first program voltage to a first word line of the word lines. The first word line is coupled to a first row of the memory cells. The control circuitry is also configured to, after applying the first program voltage to the first word line, apply a second program voltage to a second word line of the word lines. The second word line is coupled to a second row of the memory cells. The control circuitry is also configured to, after applying the second program voltage to the second word line, apply a first pre-charge voltage to the first word line and a second pre-charge voltage to the second word line. The second pre-charge voltage is greater than the first pre-charge voltage.

20 Claims, 7 Drawing Sheets

Related U.S. Application Data continuation of application No. 16/699,115, filed on Nov. 29, 2019, now Pat. No. 11,024,371, which is a continuation of application No. PCT/CN2019/110767, filed on Oct. 12, 2019.

(51) Int. Cl.
*G11C 16/24* (2006.01)
*H10B 41/27* (2023.01)

(56) References Cited

U.S. PATENT DOCUMENTS

| | | | |
|---|---|---|---|
| 9,202,575 B2* | 12/2015 | Yamamoto | G11C 16/3427 |
| 9,343,169 B2 | 5/2016 | Vali | |
| 9,460,805 B1 | 10/2016 | Pang et al. | |
| 10,056,135 B2 | 8/2018 | Shalvi | |
| 10,217,515 B2 | 2/2019 | Goda | |
| 10,636,498 B1 | 4/2020 | Lien et al. | |
| 2008/0089128 A1 | 4/2008 | Mokhlesi | |
| 2008/0310224 A1 | 12/2008 | Roohparvar et al. | |
| 2009/0010068 A1 | 1/2009 | Lee | |
| 2011/0205817 A1 | 8/2011 | Yoon et al. | |
| 2011/0222342 A1 | 9/2011 | Yoon et al. | |
| 2012/0320673 A1 | 12/2012 | Kwak | |
| 2013/0250690 A1 | 9/2013 | Lai et al. | |
| 2013/0279258 A1 | 10/2013 | Lee | |
| 2015/0003152 A1 | 1/2015 | Kwak et al. | |
| 2015/0039809 A1* | 2/2015 | Kim | G11C 16/0483 711/103 |
| 2015/0170755 A9 | 6/2015 | Vali | |
| 2016/0078949 A1 | 3/2016 | Abe | |
| 2018/0286476 A1 | 10/2018 | Vali | |
| 2019/0147962 A1 | 5/2019 | Chen et al. | |

FOREIGN PATENT DOCUMENTS

| | | |
|---|---|---|
| CN | 102576566 A | 7/2012 |
| CN | 101796591 B | 4/2013 |
| CN | 102138181 B | 9/2014 |
| CN | 108028070 A | 5/2018 |
| CN | 105190763 B | 6/2019 |
| TW | 200625333 | 7/2006 |
| WO | 2007/076512 A2 | 7/2007 |
| WO | 2008/157037 A2 | 12/2008 |
| WO | 2013/090003 A1 | 6/2013 |

* cited by examiner

METHOD OF PROGRAMMING MEMORY DEVICE AND RELATED MEMORY DEVICE

CROSS REFERENCE TO RELATED APPLICATIONS

This application is a continuation of U.S. application Ser. No. 17/241,010, filed Apr. 26, 2021, which is a continuation of U.S. application Ser. No. 16/699,115, filed Nov. 29, 2019, which is a continuation of International Application No. PCT/CN2019/110767 filed Oct. 12, 2019, all of which are incorporated herein by reference in their entireties.

BACKGROUND

The present disclosure is related to a method of programming a memory device and related memory device, and more particularly, to a method of programming a memory device with 3D QLC structure and related memory device.

Semiconductor memory has become more popular for use in various electronic devices. For example, non-volatile semiconductor memory is applied in cellular telephones, digital cameras, personal digital assistants, mobile computing devices, non-mobile computing devices and other devices. Recently, ultra high density storage devices have been proposed using a three-dimensional (3D) stacked memory structure sometimes referred to as a Bit Cost Scalable (BiCS) architecture. For example, a 3D NAND stacked flash memory device can be formed from an array of alternating conductive and dielectric layers. A memory hole is drilled in the layers to define many memory layers simultaneously. A NAND string is then formed by filling the memory hole with appropriate materials. Control gates of the memory cells are provided by the conductive layers.

A single-level cell (SLC) non-volatile memory can only store only one bit per memory element, while a multi-level cell (MLC) non-volatile memory can store more than one bit per cell. For example, a NAND memory having 16 voltage levels per cell may be referred to as quad-level cell (QLC) memory and may represent 4 bits of data per cell.

Each planar NAND memory consists of an array of memory cells connected by multiple word lines and bit lines. Data is programmed into or read from the planar NAND memory on a page-by-page basis. In order to mitigate the effect of floating gate-to-floating gate coupling, a 3D QLC NAND memory may be programmed through coarse and fine programming to improve overall programming speed. In a prior art programming method, a first word line is programmed to a first voltage $V_{PGM1}$ with coarse programming, a second word line is programmed to the first voltage $V_{PGM1}$ with coarse programming, the first word line is programmed to a second voltage $V_{PGM2}$ with fine coarse programming, and the second word line is programmed to the second voltage $V_{PGM2}$ with fine coarse programming, wherein $V_{PGM2} > V_{PGM1}$.

During the fine programming of the first word line when the selected bit line is being pre-charged, the signal path between the first and second word lines is cut off and the residual electrons generated when coarse-programming the first word line are unable to be drained. Therefore, the programming method tends to induce program disturb.

SUMMARY

The present disclosure provides a method of programming a memory device which includes a plurality of memory cells coupled to a plurality of word lines and a plurality of bit lines. The method includes performing a coarse programming on a first word line among the plurality of word lines, performing the coarse programming on a second word line among the plurality of word lines, pre-charging an unselected bit line among the plurality of bit lines during a first period after performing the coarse programming on the first word line and the second word line, turning on a channel between the unselected bit line and the second word line at a start of the first period and turning off the channel between the unselected bit line and the second word line prior to an end of the first period, and performing a fine programming on the first word line during a second period subsequent to the first period.

The present disclosure also provides a method of programming a memory device which includes a plurality of memory cells coupled to a plurality of word lines and a plurality of bit lines. The method includes performing a coarse programming on a first word line among the plurality of word lines, performing the coarse programming on a second word line among the plurality of word lines, pre-charging an unselected bit line among the plurality of bit lines during a first period after performing the coarse programming on the first word line and the second word line, reducing a channel voltage of the first word line during the first period, and performing a fine programming on the first word line during a second period subsequent to the first period.

The present disclosure also provides a memory device which includes a plurality of word lines, a plurality of bit lines, a plurality of memory cells coupled to the plurality of word lines and the plurality of bit lines, and a control unit. The control unit is configured to perform a coarse programming on a first word line among the plurality of word lines, perform the coarse programming on a second word line among the plurality of word lines, pre-charge an unselected bit line among the plurality of bit lines during a first period after performing the coarse programming on the first word line and the second word line, turn on a channel between the unselected bit line and the second word line at a start of the first period and turn off the channel between the unselected bit line and the second word line prior to an end of the first period, and perform a fine programming on the first word line during a second period subsequent to the first period.

The present disclosure also provides a memory device which includes a plurality of word lines, a plurality of bit lines, a plurality of memory cells coupled to the plurality of word lines and the plurality of bit lines, and a control unit. The control unit is configured to perform a coarse programming on a first word line among the plurality of word lines, perform the coarse programming on a second word line among the plurality of word lines, pre-charge an unselected bit line among the plurality of bit lines during a first period after performing the coarse programming on the first word line and the second word line, reduce a channel voltage of the first word line during the first period, and perform a fine programming on the first word line during a second period subsequent to the first period.

These and other objectives of the present disclosure will no doubt become obvious to those of ordinary skill in the art after reading the following detailed description of the preferred embodiment that is illustrated in the various figures and drawings.

DETAILED DESCRIPTION

Figures 1, 2:
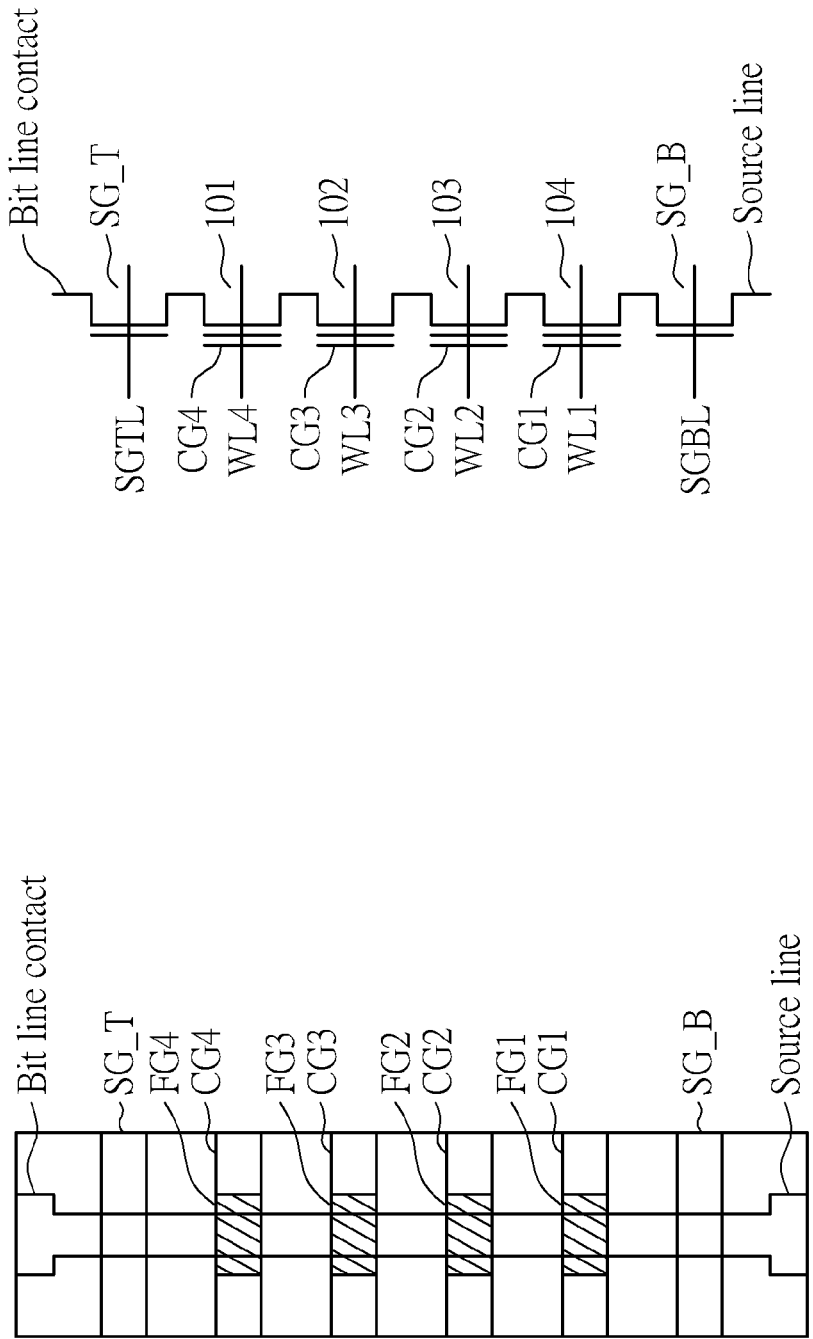
FIG. 1 is a top-view diagram illustrating a NAND string according to an embodiment of the present disclosure.
FIG. 2 is a diagram illustrating an equivalent circuit of a NAND string according to an embodiment of the present disclosure.

FIG. 1 is a top-view diagram illustrating a NAND string according to an embodiment of the present disclosure. FIG. 2 is a diagram illustrating an equivalent circuit thereof. In a flash memory system using the NAND structure, multiple transistors are arranged in series and sandwiched between two select gates, which are referred to as a NAND string. The NAND string depicted in FIGS. 1 and 2 includes four transistors 101~104 coupled in series and sandwiched between a top select gate SG_T (on the drain side) and a bottom select gate SG_BS (on the source side). The top select gate SG_T is arranged for connecting the NAND string to a bit line via a bit line contact and may be controlled by applying appropriate voltages to a select gate line SGTL. The bottom select gate SG_B is arranged for connecting the NAND string to a source line and may be controlled by applying appropriate voltages to a select gate line SGBL. Each of the transistors 101~104 includes a control gate and a floating gate. For example, the transistor 101 includes a control gate CG1 and a floating gate FG1, the transistor 102 includes a control gate CG2 and a floating gate FG2, the transistor 103 includes a control gate CG3 and a floating gate FG3, and the transistor 104 includes a control gate CG4 and a floating gate FG4. The control gate CG1 is connected to a word line WL1, the control gate CG2 is connected to a word line WL2, the control gate CG3 is connected to a word line WL3, and the control gate CG4 is connected to a word line WL4.

For illustrative purposes, FIGS. 1 and 2 show four memory cells in the NAND string. In other embodiments, a NAND string may include 8 memory cells, 16 memory cells, 32 memory cells, 64 memory cells, 128 memory cells, etc. However, the number of memory cells in a NAND string does not limit the scope of the present disclosure.

A typical architecture for a flash memory system using a NAND structure includes several NAND strings. Each NAND string is connected to the source line by its bottom select gate SG_B controlled by the select line SGBL and connected to its associated bit line by its top select gate SG_T controlled by the select line SGTL. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to one or more sense amplifiers.

Figure 3:
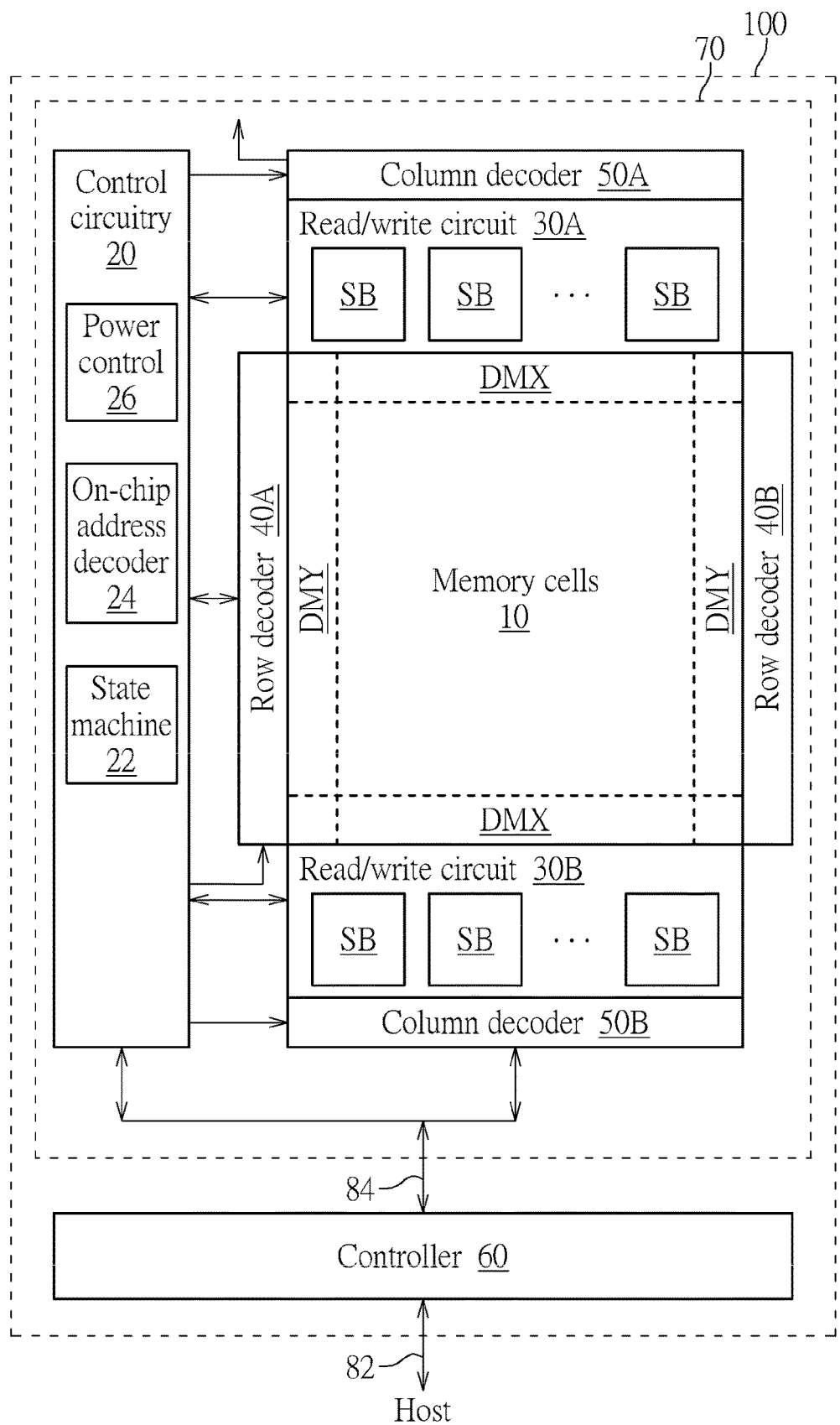
FIG. 3 is a diagram illustrating a memory device 100 having read/write circuits for reading and programming memory cells according to an embodiment of the present disclosure.

FIG. 3 is a diagram illustrating a memory device 100 having read/write circuits for reading and programming a page (or other unit) of memory cells in parallel according to an embodiment of the present disclosure. The memory device 100 includes an array (two-dimensional or three dimensional) of memory cells 10, a control circuitry 20, read/write circuits 30A and 30B, row decoders 40A and 40B, column decoders 50A and 50B, and a controller 60. In one embodiment, access to the memory array 10 by the various peripheral circuits is implemented in a symmetric fashion, on opposite sides of the array, so that the densities of access lines and circuitry on each side are reduced by half. The read/write circuits 30A and 30B include multiple sense blocks SB which allow a page of memory cells to be read or programmed in parallel. The array of memory cells 10 is addressable by word lines via the row decoders 40A and 40B and by bit lines via the column decoders 50A and 50B. In a typical embodiment, the memory cells 10, the control circuitry 20, the read/write circuits 30A and 30B, the row decoders 40A and 40B, and the column decoders 50A and 50B may be fabricated on a memory chip 70. Commands and data are transferred between a host and the controller 60 via a signal line 82 and between the controller 60 and the memory chip 70 via a signal line 84. A plurality of dummy cells, dummy word lines and dummy bit lines (not shown) may be laid in dummy storage areas DMX and DMY typically located along the sides of the memory array 10 for running read/write tests after the completion of the memory device 100.

The control circuitry 20 is configured to cooperate with the read/write circuits 30A and 30B for performing memory operations on the array of memory cells 10. The control circuitry 20 includes a state machine 22, an on-chip address decoder 24 and a power control module 26. The state machine 22 is configured to provide chip-level control of memory operations. The on-chip address decoder 24 is configured to provide an address interface between that used by the host or a memory controller to the hardware address used by the row decoders 40A, 40B and the column decoders 50A, 50B. The power control module 26 is configured to control the power and voltages supplied to the word lines and bit lines during each memory operation.

Figure 4:
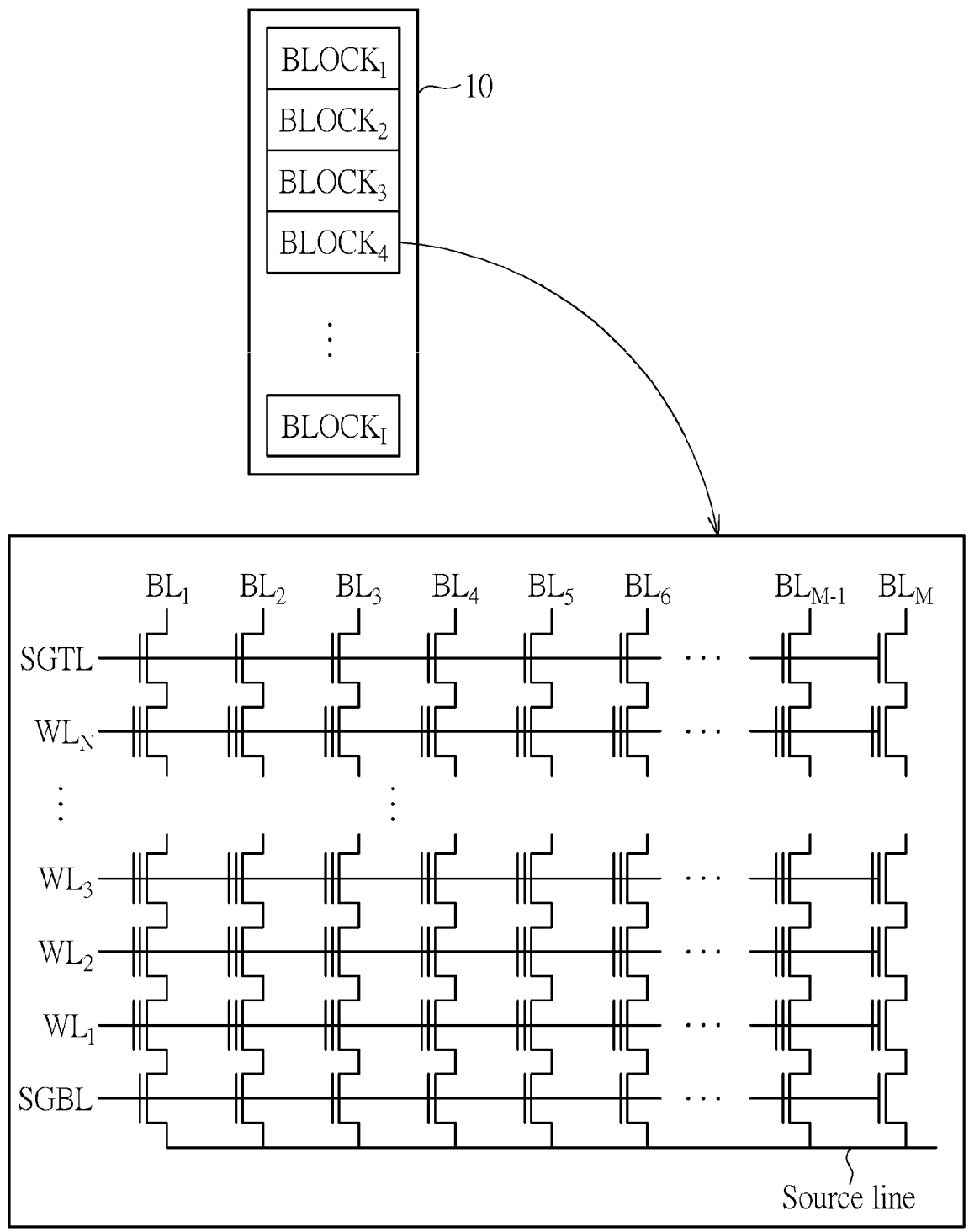
FIG. 4 is a diagram illustrating an exemplary structure of an array of memory cells according to an embodiment of the present disclosure.

FIG. 4 is a diagram illustrating an exemplary structure of the array of memory cells 10 according to an embodiment of the present disclosure. The array of memory cells 10 is divided into multiple blocks of memory cells denoted by $BLOCK_1$~$BLOCK_I$, wherein I is a positive integer and typically equal to a large number. A block contains a set of NAND strings which are accessed via bit lines $BL_1$-$BL_M$ and a common set of word lines $WL_1$~$WL_N$, wherein M and N are integers larger than 1. One terminal of the NAND string is connected to a corresponding bit line via the top select gate (connected to the select gate line SGTL), and another terminal is connected to the source line via the bottom select gate (connected to select gate line SGBL). Each block is typically divided into a number of pages. In one embodiment, a block is the unit of conventional erase and a page is the unit of conventional programming. However, other units of erase/program can also be used.

In an embodiment, the array of memory cells 10 includes a triple well comprising a p-type substrate, an n-well within the p-type substrate, and a p-well within the n-well. The channel regions, source regions and drain regions are typically positioned in the p-well. The p-well and n-well are considered part of the p-type substrate, wherein the entire array of memory cells 10 is within one p-well, with trenches in the p-well providing electrical isolation between NAND strings. In another embodiment, the array of memory cells 01 includes a triple well comprising an n-type substrate, a p-well within the n-type substrate, and an n-well within the p-well. The p-well and n-well are considered part of the n-type substrate, wherein the channel regions, the source regions and the drain regions are typically positioned in the n-well. However, the implementation of the memory cells in a NAND string does not limit the scope of the present disclosure.

In the present disclosure, the memory device 100 may be a NAND memory device wherein the array of memory cells 10 are laid in a 3D QLC structure. However, the type of the memory device 100 does not limit the scope of the present disclosure.

Figure 5:
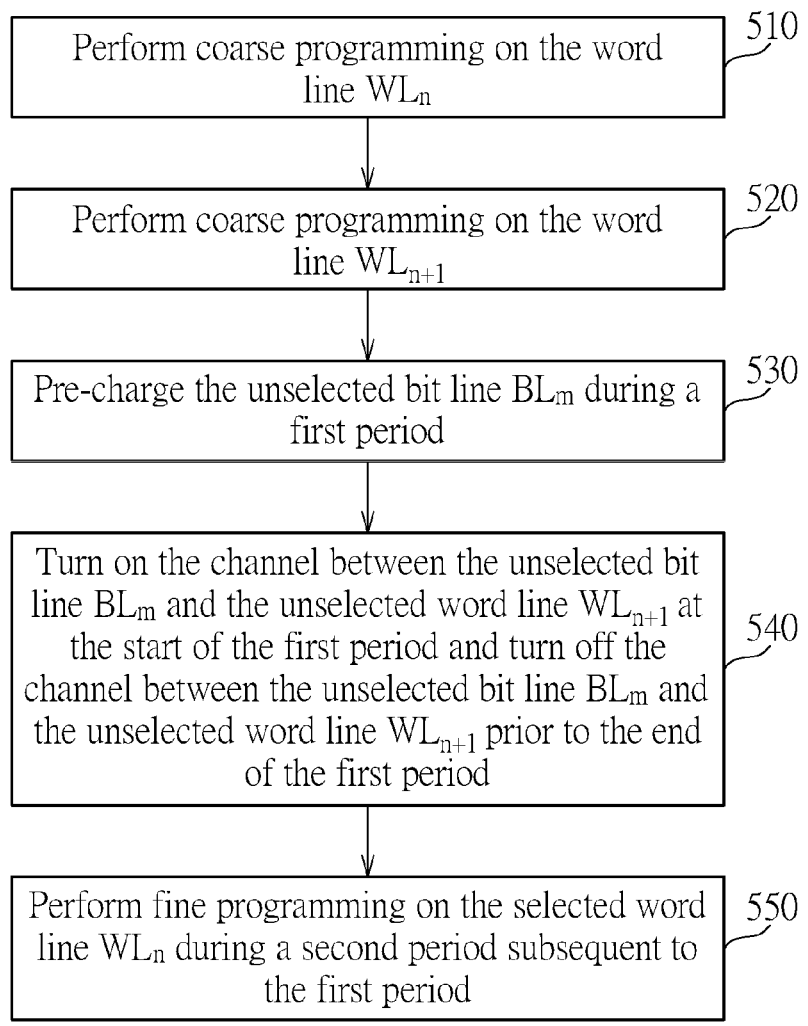
FIG. 5 is a flowchart illustrating a method of programming an array of memory cells in a memory device according to an embodiment of the present disclosure.

FIG. 5 is a flowchart illustrating a method of programming the array of memory cells 10 in the memory device 100 according to an embodiment of the present disclosure. For illustrative purpose, the memory cells controlled by a bit line $BL_m$ among the plurality of bit lines $BL_1$-$BL_M$ and two adjacent word lines $WL_n$ and $WL_{n+1}$ among the common set of word lines $WL_1$~$WL_N$ are addressed, wherein m is a positive integer smaller than M, and n is a positive integer smaller than N. The flowchart in FIG. 5 includes the following steps:

Step 510: perform coarse programming on the word line $WL_n$.

Step 520: perform coarse programming on the word line $WL_{n+1}$.

Step 530: pre-charge the unselected bit line $BL_m$ during a first period.

Step 540: turn on the channel between the unselected bit line $BL_m$ and the unselected word line $WL_{n+1}$ at the start of the first period and turn off the channel between the unselected bit line $BL_m$ and the unselected word line $WL_{n+1}$ prior to the end of the first period.

Step 550: perform fine programming on the selected word line $WL_n$ during a second period subsequent to the first period.

In one embodiment, one or any combination of the control circuitry 20, the read/write circuits 30A and 30B, the row decoders 40A and 40B, the column decoders 50A and 50B, and/or the controller 60 may be referred to as a control unit capable of performing the processes of programming as depicted in FIG. 5.

In step 510, coarse programming may be performed on the word line $WL_n$ by ramping the word line $WL_n$ to a first voltage $V_{PGM1}$. If more than one page on the word line $WL_n$ are to be programmed, all of the pages to be programmed are coarse-programmed prior to proceeding to the next word line $WL_{n+1}$.

In step 520, coarse programming may be performed on the word line $WL_{n+1}$ by ramping the word line $WL_{n+1}$ to the first voltage $V_{PGM1}$. If more than one page on the word line $WL_{n+1}$ are to be programmed, all of the pages to be programmed are coarse-programmed prior to proceeding to the next word line.

Figure 6:
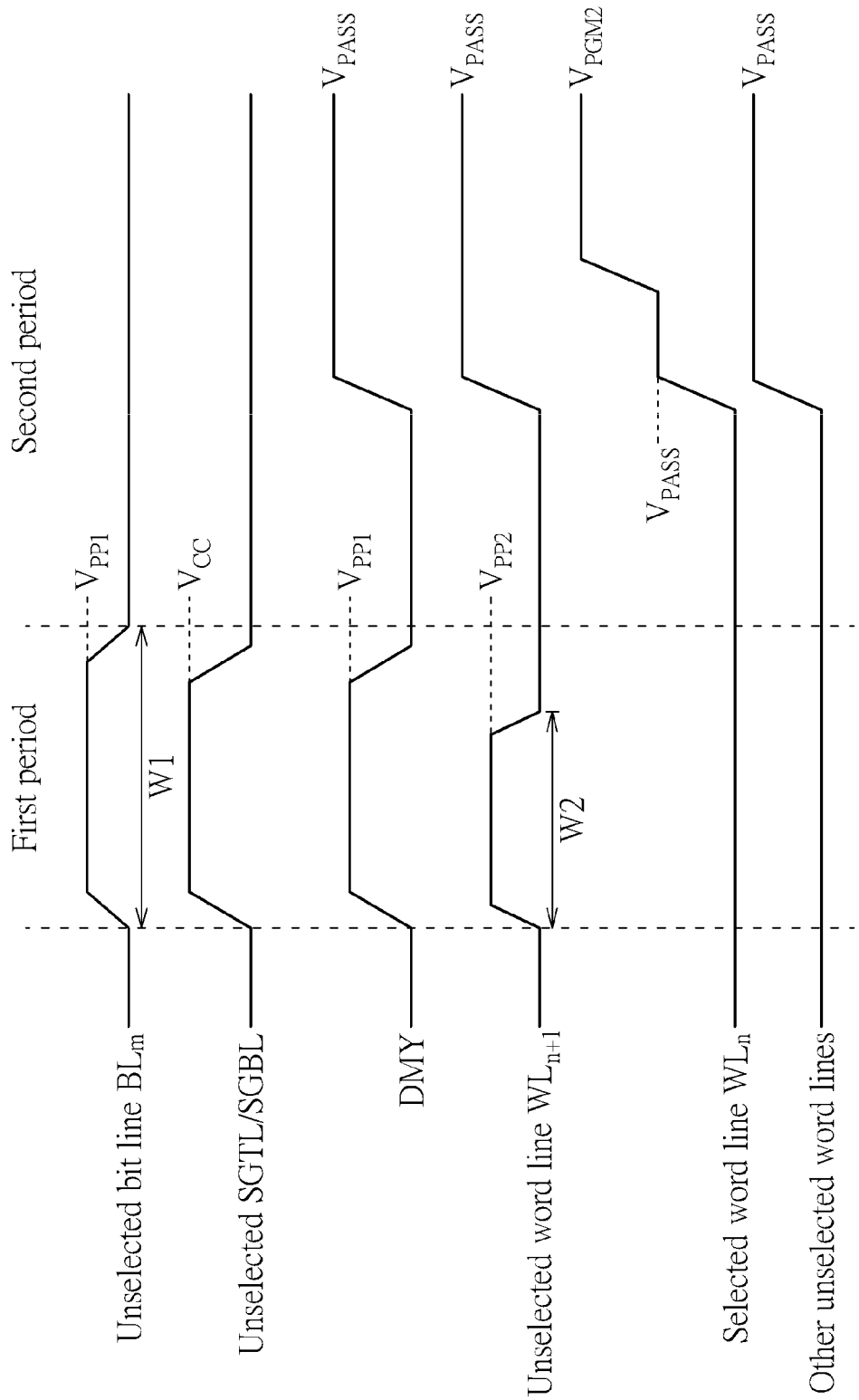
FIG. 6 is a diagram illustrating an embodiment of executing the method depicted in FIG. 5.

FIG. 6 is a diagram illustrating an embodiment of executing steps 530 and 540 in the method depicted in FIG. 5. FIG. 6 depicts the levels of related signal lines which will be explained along with the flowchart in FIG. 5.

In step 530, the unselected bit line $BL_m$ may be pre-charged by applying a pre-pulse voltage $V_{PP1}$ having a first width W1 to the unselected bit line $BL_m$ during the first period. In step 540, the channel between the unselected bit line $BL_m$ and the unselected word line $WL_{n+1}$ may be turned on by applying a second pre-pulse voltage $V_{PP2}$ having a second width W2 to the unselected word line $WL_{n+1}$ at the start of the first period, wherein the second width W2 is smaller than the first width W1. Also, the rising edges of the pre-pulse voltages $V_{PP1}$ and $V_{PP2}$ are aligned so that the channel between the unselected bit line $BL_m$ and the unselected word line $WL_{n+1}$ may be turned off prior to the end of the first period. Therefore, residual electrons on the selected word line $WL_n$ generated in step 510 may be drained via the channel between the unselected bit line $BL_m$ and the unselected word line $WL_{n+1}$.

In the present disclosure, the method of programming the array of memory cells 10 in the memory device 100 may further include pre-charging the unselected select gate lines SGTL and SGBL by applying a pre-pulse voltage $V_{CC}$, biasing the dummy storage region DMY at the pre-pulse voltage $V_{PP1}$, and biasing all word lines except the word line $WL_{n+1}$ at a ground voltage during the first period.

In step 550, fine programming may be performed on the selected word line $WL_n$ during the second period by biasing the unselected bit line $BL_m$ and the unselected select gate lines SGTL and SGBL at the ground voltage, ramping the dummy storage region DMY to a pass voltage $V_{PASS}$, ramping the selected word line $WL_n$ to the pass voltage $V_{PASS}$ and then to a second voltage $V_{PGM2}$ which is larger than the first voltage $V_{PGM1}$ and the pass voltage $V_{PASS}$, and ramping all word lines except the word line $WL_n$ to the pass voltage $V_{PASS}$ during the second period. If more than one page on the word line $WL_n$ are to be programmed, all of the pages to be programmed are fine-programmed prior to proceeding to the next word line $WL_{n+1}$.

Figure 7:
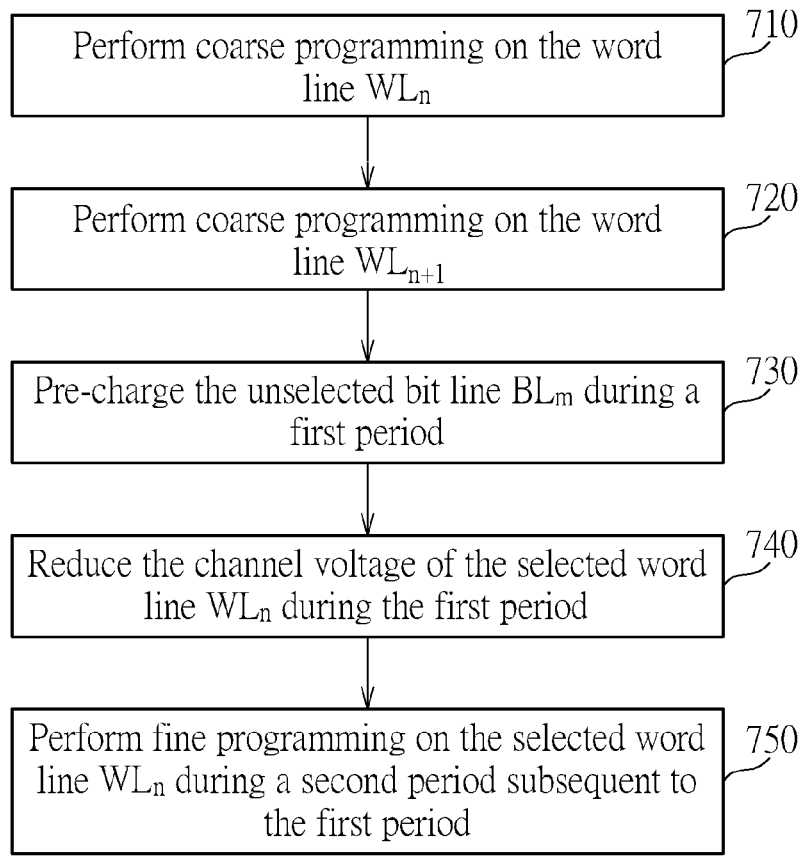
FIG. 7 is a flowchart illustrating a method of programming an array of memory cells in a memory device according to another embodiment of the present disclosure.

FIG. 7 is a flowchart illustrating a method of programming the array of memory cells 10 in the memory device 100 according to another embodiment of the present disclosure. For illustrative purpose, the memory cells controlled by a bit line $BL_m$ among the plurality of bit lines $BL_1$-$BL_M$ and two adjacent word lines $WL_n$ and $WL_{n+1}$ among the common set of word lines $WL_1$~$WL_N$ are addressed, wherein m is a positive integer smaller than M, and n is a positive integer smaller than N. The flowchart in FIG. 7 includes the following steps:

Step 710: perform coarse programming on the word line $WL_n$.

Step 720: perform coarse programming on the word line $WL_{n+1}$.

Step 730: pre-charge the unselected bit line $BL_m$ during a first period.

Step 740: reduce the channel voltage of the selected word line $WL_n$ during the first period.

Step 750: perform fine programming on the selected word line $WL_n$ during a second period subsequent to the first period.

The implementation of step 710-730 and 750 are the similar to the implementation of step 510-530 and 550 as previously stated.

Figure 8:
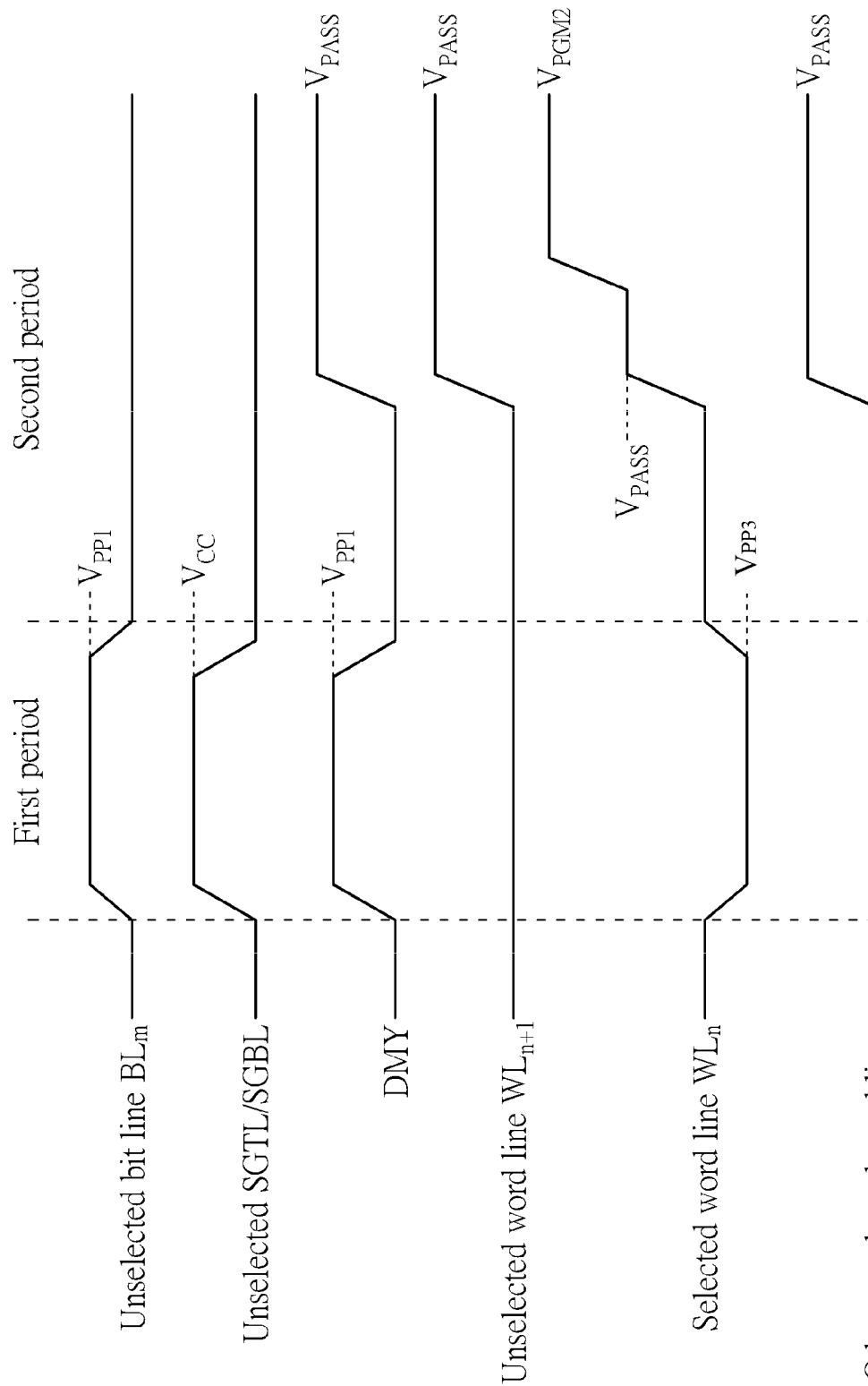
FIG. 8 is a diagram illustrating an embodiment of executing the method depicted in FIG. 7.

FIG. 8 is a diagram illustrating an embodiment of executing steps 730 and 740 in the method depicted in FIG. 7. FIG. 8 depicts the levels of related signal lines which will be explained along with the flowchart in FIG. 7.

In step 740, the channel voltage of the selected word line $WL_n$ may be reduced by applying a negative pre-pulse voltage $V_{PP3}$ to the selected word line $WL_n$ during the first period. Therefore, residual electrons on the selected word line $WL_n$ generated in step 710 may be expelled from the selected word line $WL_n$.

In the present disclosure, coarse and fine programming may be adopted to improve overall programming speed.

After coarse-programming a selected word line and before fine-programming the selected word line, the channel between a corresponding unselected bit line and an adjacent unselected word line may be turned on in order to drain residual electrons on the selected word line which are generated during coarse-programming. Alternatively, the channel voltage of the selected word line may be reduced in order to expel residual electrons on the selected word line which are generated during coarse-programming. Therefore, the present method can reduce program disturb when programming the memory cells in a memory device.

Those skilled in the art will readily observe that numerous modifications and alterations of the device and method may be made while retaining the teachings of the present disclosure. Accordingly, the above disclosure should be construed as limited only by the metes and bounds of the appended claims.

What is claimed is:

1. A memory device, comprising:
   memory cells;
   a plurality of word lines respectively coupled to the memory cells; and
   a peripheral circuit coupled to the memory cells via the plurality of word lines, and configured to:
   apply a first program voltage to a first word line of the plurality of word lines;
   after applying the first program voltage to the first word line, perform a program pre-charge operation comprising:
   during a second word line of the plurality of word lines is at a second voltage and a pre-pulse voltage is applied to a bit line coupled to, in a column, a memory cell of the memory cells, applying a first voltage to the first word line, wherein the first voltage is greater than the second voltage; and
   terminating applying the pre-pulse voltage to the bit line; and
   after the program pre-charge operation, apply a second program voltage to the second word line.

2. The memory device of claim 1, wherein the first voltage is a positive bias voltage.

3. The memory device of claim 1, wherein the first word line is adjacent to the second word line.

4. The memory device of claim 1, wherein the first voltage is a ground voltage, and the second voltage is a negative bias voltage.

5. The memory device of claim 1, wherein the peripheral circuit is further configured to:
   before the program pre-charge operation, apply a third program voltage to the second word line;
   during applying the third program voltage to the second word line, apply a pass voltage to the first word line; and
   during applying the first program voltage to the first word line, apply the pass voltage to the second word line.

6. The memory device of claim 1, wherein the peripheral circuit is further configured to, before applying the first program voltage to the first word line, apply a third program voltage to the second word line.

7. The memory device of claim 1, wherein the peripheral circuit is further configured to:
   apply the pre-pulse voltage having a first duration to the bit line coupled to, in the column, the memory cell of the memory cells; and
   apply the first voltage having a second duration to the first word line, the first duration being longer than the second duration.

8. The memory device of claim 7, wherein the peripheral circuit is further configured to simultaneously apply the pre-pulse voltage to the bit line and the first voltage to the first word line.

9. The memory device of claim 1, wherein the peripheral circuit is further configured to:
   apply the pre-pulse voltage to the bit line; and
   start ramping down from the pre-pulse voltage after starting ramping down from the first voltage during the program pre-charge operation.

10. The memory device of claim 1, wherein the peripheral circuit is further configured to perform a program loop comprises performing the program pre-charge operation and applying the second program voltage to the second word line.

11. A system, comprising:
    a memory device comprising:
    memory cells;
    a plurality of word lines respectively coupled to the memory cells; and
    a peripheral circuit coupled to the memory cells via the plurality of word lines, and configured to:
    apply a first program voltage to a first word line of the plurality of word lines;
    after applying the first program voltage to the first word line, perform a program pre-charge operation comprising:
    during a second word line of the plurality of word lines is at a second voltage and a pre-pulse voltage is applied to a bit line coupled to, in a column, a memory cell of the memory cells, applying a first voltage to the first word line, wherein the first voltage is greater than the second voltage; and
    terminating applying the pre-pulse voltage to the bit line; and
    after the program pre-charge operation, apply a second program voltage to the second word line.

12. The system of claim 11, wherein the first voltage is a positive bias voltage.

13. The system of claim 11, wherein the first word line is adjacent to the second word line.

14. The system of claim 11, wherein the first voltage is a ground voltage, and the second voltage is a negative bias voltage.

15. The system of claim 11, wherein the peripheral circuit is further configured to, before applying the first program voltage to the first word line, apply a third program voltage to the second word line.

16. The system of claim 11, wherein the peripheral circuit is further configured to:
    apply the pre-pulse voltage having a first duration to the bit line coupled to, in the column, the memory cell of the memory cells; and
    apply the first voltage having a second duration to the first word line, wherein the first duration is longer than the second duration.

17. The system of claim 16, wherein the peripheral circuit is further configured to simultaneously apply the pre-pulse voltage to the bit line and the first voltage to the first word line.

18. A method for programming a memory device, the memory device comprising memory cells, and a plurality of word lines respectively coupled to the memory cells, the method comprising:
    applying a first program voltage to a first word line of the plurality of word lines;

after applying the first program voltage to the first word line, performing a program pre-charge operation comprising:
- during a second word line of the plurality of word lines is at a second voltage and a pre-pulse voltage is applied to a bit line coupled to, in a column, a memory cell of the memory cells, applying a first voltage to the first word line, wherein the first voltage is greater than the second voltage; and
- terminating applying the pre-pulse voltage to the bit line; and after performing the program pre-charge operation, applying a second program voltage to the second word line.

19. The method of claim 18, wherein the first voltage is a positive bias voltage.

20. The method of claim 18, wherein the first word line is adjacent to the second word line.

\* \* \* \* \*